United States Patent
Hodono

(10) Patent No.: US 8,135,251 B2
(45) Date of Patent: Mar. 13, 2012

(54) OPTO-ELECTRIC HYBRID BOARD AND MANUFACTURING METHOD THEREOF

(75) Inventor: Masayuki Hodono, Ibaraki (JP)

(73) Assignee: Nitto Denko Corporation, Ibaraki-shi, Osaka (JP)

( * ) Notice: Subject to any disclaimer, the term of this patent is extended or adjusted under 35 U.S.C. 154(b) by 308 days.

(21) Appl. No.: 12/624,899

(22) Filed: Nov. 24, 2009

(65) Prior Publication Data

US 2010/0129026 A1 May 27, 2010

Related U.S. Application Data

(60) Provisional application No. 61/120,635, filed on Dec. 8, 2008.

(30) Foreign Application Priority Data

Nov. 27, 2008 (JP) .................................. 2008-302868

(51) Int. Cl.
   - *G02B 6/26* (2006.01)
   - *G02B 6/12* (2006.01)
   - *G02B 6/13* (2006.01)
   - *H05K 3/00* (2006.01)
   - *H01L 21/00* (2006.01)

(52) U.S. Cl. ............ 385/52; 385/14; 385/129; 385/130; 385/131; 29/829; 438/29; 438/31

(58) Field of Classification Search .................... 385/14, 385/31, 49, 52, 88, 92, 94, 129, 130, 131, 385/132; 438/29, 31; 29/829

See application file for complete search history.

(56) References Cited

U.S. PATENT DOCUMENTS

| 6,533,391 | B1 * | 3/2003 | Pan .................................. 347/42 |
| 6,643,434 | B2 * | 11/2003 | Cayrefourcq et al. .......... 385/52 |
| 7,283,710 | B2 * | 10/2007 | Sano et al. ...................... 385/49 |
| 2006/0007972 | A1 * | 1/2006 | Ericson et al. ............. 372/43.01 |

(Continued)

FOREIGN PATENT DOCUMENTS

JP        2004-302345 A        10/2004

(Continued)

OTHER PUBLICATIONS

Decision to Grant a Patent dated May 17, 2011, issued in corresponding Japanese Patent Application No. 2008-302868.

(Continued)

*Primary Examiner* — Brian Healy
(74) *Attorney, Agent, or Firm* — Westerman, Hattori, Daniels & Adrian, LLP

(57) ABSTRACT

An opto-electric hybrid board in which a new alignment mark having an identifying mark that is easy to recognize is formed in addition to a conventional alignment mark, and a method of manufacturing the opto-electric hybrid board. The opto-electric hybrid board includes an optical waveguide portion 2, an electric circuit board 1, and optical elements mounted on this electric circuit board 1. The optical waveguide portion 2 includes a translucent under cladding layer 21, a linear core 22 for an optical path, first alignment marks 24 positioned relative to end portions of this core 22, and an over cladding layer 23 for covering the above-mentioned core 22 and the first alignment marks 24. The electric circuit board 1 includes second alignment marks 15 for positioning of the optical elements and formed on a surface thereof on which the optical elements are mounted.

4 Claims, 8 Drawing Sheets

U.S. PATENT DOCUMENTS

| | | |
|---|---|---|
| 2006/0045427 A1* | 3/2006 | Sano et al. .................... 385/49 |
| 2007/0170603 A1 | 7/2007 | Takahashi et al. |
| 2010/0061679 A1 | 3/2010 | Hayashi et al. |
| 2010/0129026 A1* | 5/2010 | Hodono .................... 385/14 |

FOREIGN PATENT DOCUMENTS

| | | |
|---|---|---|
| JP | 2007-258374 A | 10/2007 |
| JP | 2008-058926 A1 | 3/2008 |

OTHER PUBLICATIONS

Japanese Office Action dated Mar. 1, 2011, issued in corresponding Japanese Patent Application No. 2008-302868.

European Search Report dated Jun. 24, 2011, issued in corresponding European Patent Application No. 09176770.7.

* cited by examiner

PRIOR ART

PRIOR ART

F I G. 9
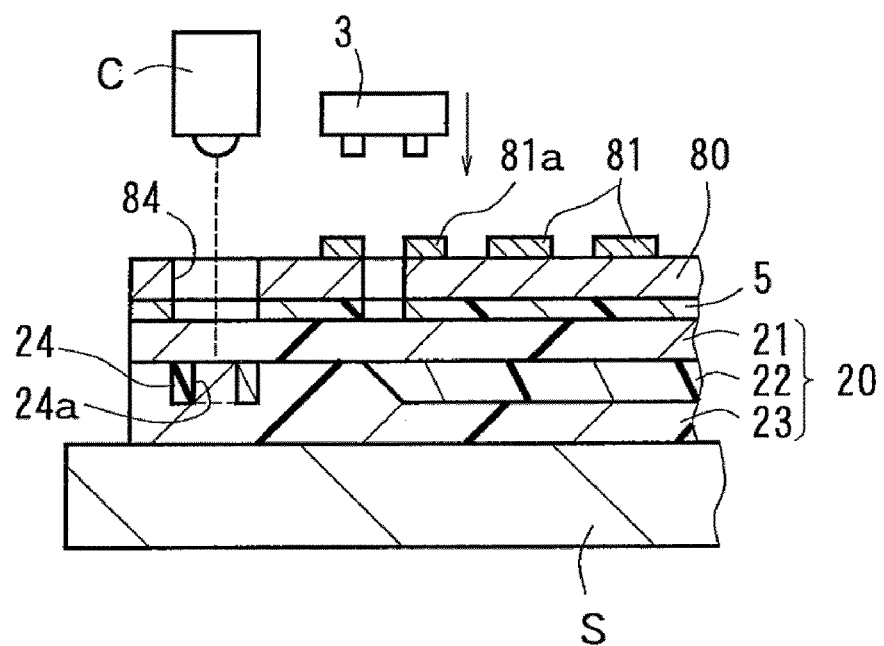
PRIOR ART

US 8,135,251 B2

OPTO-ELECTRIC HYBRID BOARD AND MANUFACTURING METHOD THEREOF

RELATED APPLICATIONS

This application claims the benefit of U.S. Provisional Application No. 61/120,635, filed Dec. 8, 2008, which is hereby incorporated by reference.

BACKGROUND OF THE INVENTION

1. Field of the Invention

The present invention relates to an opto-electric hybrid board including an optical waveguide portion, an electric circuit portion, and an optical element mounted on this electric circuit portion, and to a manufacturing method thereof.

2. Description of the Related Art

An opto-electric hybrid board is constructed, for example, as shown in FIG. 7, by bonding an electric circuit portion 6 and an optical waveguide portion 7 to each other with an adhesive 5, and then mounting a light-emitting element 3 and a light-receiving element 4 on the above-mentioned electric circuit portion 6. The above-mentioned optical waveguide portion 7 includes an optical waveguide 70 in which an under cladding layer 71, a core 72, and an over cladding layer 73 are disposed in the order named as seen from the above-mentioned electric circuit portion 6 side. The opposite end portions of this optical waveguide 70 are formed as inclined surfaces inclined at 45 degrees to an optical axis, and core 72 portions of the respective inclined surfaces are formed as light reflecting surfaces 72a. The above-mentioned electric circuit portion 6 is constructed by forming an electric circuit 61 on one surface of a substrate 60. Part of the electric circuit 61 serves as mounting pads 61a for mounting the light-emitting element 3 and the light-receiving element 4 described above thereon. The above-mentioned substrate 60 is formed with light-passing through holes 62 and 63 for propagation of light L between the end portions of the core 72 and the light-emitting element 3 and light-receiving element 4. In FIG. 7, the reference character 3a designates a bump (an electrode) for the above-mentioned light-emitting element 3, and the reference character 4a designates a bump for the above-mentioned light-receiving element 4.

The propagation of the light L in the above-mentioned opto-electric hybrid board is as follows. First, the light L is emitted downwardly from the light-emitting element 3. The light L passes through the under cladding layer 71 in a first end portion (a left-hand end portion as seen in FIG. 7) of the optical waveguide 70, and then enters a first end portion of the core 72. Subsequently, the light L is reflected from the light reflecting surface 72a provided in the first end portion of the core 72, and travels through the interior of the core 72 in an axial direction. Then, the light L travels through the interior of the core 72, and is propagated to a second end portion (a right-hand end portion as seen in FIG. 7) of the core 72. Subsequently, the light L is reflected upwardly from the light reflecting surface 72a provided in the above-mentioned second end portion, passes through and exits from the under cladding layer 71, and is received by the light-receiving element 4. Thus, the accurate positioning of the light-emitting element 3 and the light-receiving element 4 relative to the opposite end portions of the core 72 of the optical waveguide 70 is important in achieving high light propagation efficiency.

To this end, there has been proposed a method of manufacturing an opto-electric hybrid board in which alignment marks 24 serving as a reference for the positioning of the light-emitting element 3 and the light-receiving element 4 are formed in an optical waveguide portion 2 so that the light-emitting element 3 and the light-receiving element 4 described above are positioned relative to the opposite end portions of a core 22 of an optical waveguide 20, as shown in FIG. 8A (see, for example, Japanese Patent Application Laid-Open No. 2004-302345). This manufacturing method includes: forming an under cladding layer 21 as the optical waveguide portion 2 with reference to FIG. 8A; thereafter forming a photosensitive resin layer having a region in which the core 22 is to be formed and a region in which the alignment marks 24 are to be formed on a surface (the lower surface as seen in the figure) of the under cladding layer 21; and then forming the core 22 and the alignment marks 24 from the photosensitive resin layer by a photolithographic process. As shown in FIG. 8B, an example of each of the alignment marks 24 is formed in the shape of a disk including in its central position a through hole 24a having the shape of a cross as seen in plan view. The cross-shaped portion serves as an identifying mark. Then, a liquid material for the formation of an over cladding layer 23 is applied to the uncovered surfaces of the under cladding layer 21, the core 22 and the alignment marks 24 described above, and is then hardened by exposure to light or the like, whereby the over cladding layer 23 is formed. At this time, the inside of each of the above-mentioned cross-shaped through holes 24a is also filled with the liquid material for the formation of the above-mentioned over cladding layer 23, and becomes part of the over cladding layer 23. In this manner, the alignment marks 24 are formed in predetermined positions relative to the opposite end portions of the core 22 together with the optical waveguide 20. On the other hand, a substrate 80 is prepared which is formed with light-passing through holes 82 and 83 and through holes 84 for the recognition of the above-mentioned alignment marks 24. Then, the above-mentioned substrate 80 is affixed to the upper surface of the under cladding layer 21 of the above-mentioned optical waveguide portion 2 with the adhesive 5, and an electric circuit 81 (including mounting pads 81a) is formed on the upper surface of the substrate 80 by a photolithographic process using the above-mentioned alignment marks 24 as a reference. Thus, an electric circuit portion 8 is produced on the above-mentioned optical waveguide portion 2, with the adhesive 5 lying therebetween. Thereafter, the light-emitting element 3 and the light-receiving element 4 are mounted on the mounting pads 81a. In this method, the above-mentioned mounting pads 81a are formed with reference to the alignment marks 24 formed in predetermined positions relative to the opposite end portions of the above-mentioned core 22. Therefore, the above-mentioned mounting pads 81a are positioned relative to the opposite end portions of the core 22.

However, there is a danger that the light-emitting element 3 and the light-receiving element 4 deviate from the above-mentioned mounting pads 81a during the mounting of the light-emitting element 3 and the light-receiving element 4 on the above-mentioned mounting pads 81a. To avoid the danger, Hodono, the inventor of the present application has proposed a method of manufacturing an opto-electric hybrid board in which, during the mounting of the light-emitting element 3 and the light-receiving element 4, as shown in FIG. 9, the above-mentioned optical waveguide portion 2 and the electric circuit portion 8 bonded together are set on a stage S of a mounting machine, the above-mentioned alignment marks 24 are recognized by means of an alignment recognition device C provided in the mounting machine, and the mounting is achieved using the alignment marks 24 as a reference, and has already applied for a patent (Japanese Patent Application No. 2008-114329) (U.S. patent application Ser. No. 12/428,669). Thus, the positioning of the light-emitting element 3 and the light-receiving element 4 described above is accomplished more properly.

In this manner, the above-mentioned alignment marks 24 are generally made of the material for the formation of the core 22 by the photolithographic process at the same time that the core 22 of the optical waveguide 20 is formed from the viewpoint of the positioning relative to the end portions of the core 22. The alignment marks 24 made of the material for the formation of the core 22 are embedded in the over cladding layer 23 at the surface of the under cladding layer 21, and the cross-shaped portion in the central position of each of the above-mentioned alignment marks 24 serves as part of the over cladding layer 23. As a result of the nature of the optical waveguide 20, the alignment marks 24 made of the material for the formation of the core 22 are translucent, and the under cladding layer 21 and the over cladding layer (including the cross-shaped portions) 23 are generally also translucent. Additionally, there is a difference in refractive index between the alignment marks 24 (approximately 1.588 as the refractive index of the core 22) and the under cladding layer 21 and over cladding layer 23 (having a refractive index of approximately 1.502 to 1.542), but the difference in refractive index is small (approximately 0.05 to 0.09).

For this reason, both the cross-shaped portions of the above-mentioned alignment marks 24 and their surrounding portions are recognized as being bright, and the difference in brightness therebetween is small. As a matter of fact, it is difficult to see the cross-shaped portions of the above-mentioned alignment marks 24 through the under cladding layer 21 by using a pattern matching scheme employed for the alignment recognition device C of the mounting machine (a scheme such that an image is converted into coordinates and numerals by the numerical conversion of the contrast between black and white; a gray scale pattern recognition scheme), as shown in FIG. 9. Additionally, the surface (the uncovered surface exposed to the through holes 84 for the recognition of the alignment marks 24; the upper surface as seen in the figure) of the under cladding layer 21 is uneven. Light for illumination or the like is reflected diffusely because of the unevenness, and it tends to be difficult to obtain an image having a constant contrast. For this reason, the recognition takes much time, and the mounting step requires a prolonged period of time. Also, there is apprehension that false recognition results. In this regard, there is room for improvement.

DISCLOSURE OF THE INVENTION

In view of the foregoing, it is an object of the present invention to provide an opto-electric hybrid board in which a new alignment mark having an identifying mark that is easy to recognize is formed in addition to a conventional alignment mark, and a method of manufacturing the opto-electric hybrid board.

To accomplish the above-mentioned object, a first aspect of the present invention is intended for an opto-electric hybrid board comprising: an optical waveguide portion; an electric circuit portion; and an optical element mounted on the electric circuit portion, said optical waveguide portion including a translucent under cladding layer, a linear core for an optical path formed on a surface of the under cladding layer, a first alignment mark formed on the surface of the under cladding layer and positioned relative to an end portion of the core, and an over cladding layer formed on the surface of the under cladding layer and for covering said core and the first alignment mark, said electric circuit portion including a second alignment mark for positioning of the optical element and formed on a surface of said electric circuit portion on which the optical element is mounted, said second alignment mark having a surface covered with a resin layer, except for an uncovered portion for identification provided by using said first alignment mark as a reference.

A second aspect of the present invention is intended for a method of manufacturing an opto-electric hybrid board including an optical waveguide portion, an electric circuit portion, and an optical element mounted on the electric circuit portion, said optical waveguide portion including a translucent under cladding layer, a linear core for an optical path formed on a surface of the under cladding layer, a first alignment mark formed on the surface of the under cladding layer and positioned relative to an end portion of the core, and an over cladding layer formed on the surface of the under cladding layer and for covering said core and the first alignment mark, wherein the production of said electric circuit portion comprises the steps of: forming an electric circuit and a second alignment mark for positioning of the optical element on a substrate; and covering a surface of the second alignment mark with a resin layer, except for an uncovered portion for identification provided by using said first alignment mark as a reference, and wherein the mounting of said optical element is achieved by using the uncovered portion for identification of said second alignment mark as a reference.

In the opto-electric hybrid board according to the present invention, the second alignment mark as a new alignment mark for the positioning of the optical element is formed on the surface of the electric circuit portion on which the optical element is mounted. The surface of the second alignment mark is covered with the resin layer, except for the uncovered portion serving as an identifying mark, by using the first alignment mark in the optical waveguide portion as a reference. Thus, the uncovered portion (the identifying mark) of the above-mentioned second alignment mark is also positioned relative to the end portion of the core, and may be used as a reference for the mounting position of the optical element. Additionally, covering the surface of the above-mentioned second alignment mark with the resin layer, except for the uncovered portion, allows the resin layer in the covered portion to be used to control luster and the like on the surface of the above-mentioned second alignment mark. For this reason, the above-mentioned uncovered portion exhibits a clear contrast to the portion covered with the resin layer, and it is easy to recognize the uncovered portion. As a result, the opto-electric hybrid board according to the present invention includes the optical element mounted with high accuracy to achieve improved light propagation efficiency.

In particular, when the above-mentioned second alignment mark is made of metal for an electric circuit, the luster on the surface of the above-mentioned second alignment mark is increased to provide a clearer contrast between the above-mentioned uncovered portion and the portion covered with the resin layer. This makes it easier to recognize the above-mentioned uncovered portion, thereby providing the optical element mounted with higher accuracy.

Also, in the method of manufacturing the opto-electric hybrid board according to the present invention, the second alignment mark as a new alignment mark for the positioning of the optical element is formed on the surface of the electric circuit portion on which the optical element is mounted, and the surface of the second alignment mark is covered with the resin layer, except for the uncovered portion serving as an identifying mark, by using as a reference the first alignment mark in the optical waveguide portion which is positioned relative to the end portion of the core. Thus, the uncovered portion (the identifying mark) of the above-mentioned second alignment mark is also positioned relative to the end portion of the core, and may be used as a reference for the mounting position of the optical element. Additionally, the uncovered portion of the above-mentioned second alignment mark exhibits a clear contrast to the portion covered with the resin layer as mentioned above, and it is easy to recognize the uncovered portion. As a result, false recognition is prevented, and the recognition is achieved in a short time, which results in improved productivity.

In particular, when the above-mentioned second alignment mark is formed using metal for the electric circuit, the second alignment mark is formed at the same time that the electric circuit is formed. This provides improved productivity. Additionally, the luster on the surface of the above-mentioned second alignment mark is increased to provide a clearer contrast between the above-mentioned uncovered portion and the portion covered with the resin layer. This makes it easier to recognize the above-mentioned uncovered portion, thereby further preventing the false recognition. Furthermore, the recognition is achieved in a shorter time.

BRIEF DESCRIPTION OF THE DRAWINGS

FIG. 9 is an illustration schematically showing the step of mounting an optical element in a manufacturing method of the above-mentioned conventional opto-electric hybrid board of FIG. 8A.

DETAILED DESCRIPTION OF THE INVENTION

Next, an embodiment according to the present invention will now be described in detail with reference to the drawings.

Figure 1A:
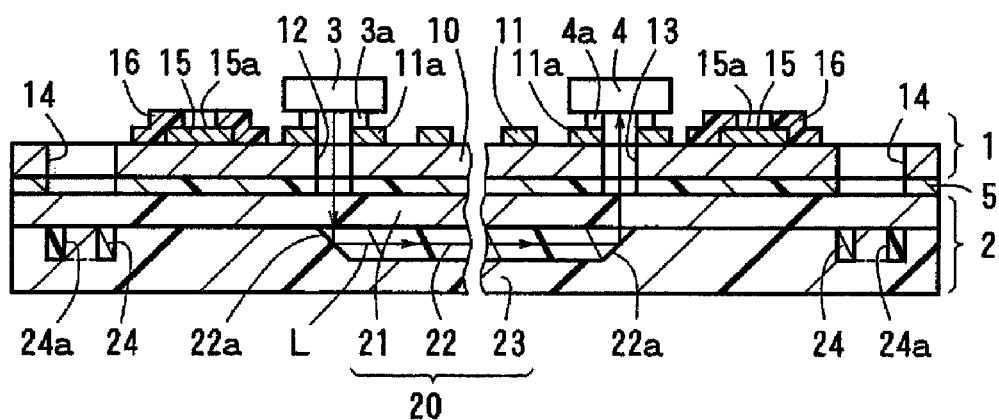
FIG. 1A is a vertical sectional view schematically showing an opto-electric hybrid board according to an embodiment of the present invention.

FIG. 1A shows an opto-electric hybrid board according to one embodiment of the present invention. This opto-electric hybrid board includes an electric circuit board (electric circuit portion) 1 having a first surface with an electric circuit 11 formed thereon, and an optical waveguide portion 2 bonded to a second surface of the electric circuit board 1 with an adhesive 5 and including an optical waveguide 20 and first alignment marks 24. Second alignment marks 15 for positioning of optical elements are further formed on the first surface of the electric circuit board 1. The opto-electric hybrid board further includes optical elements (a light-emitting element 3 and a light-receiving element 4) mounted on portions (mounting pads 11a) of the above-mentioned electric circuit 11 corresponding to end portions of a core 22 of the above-mentioned optical waveguide 20 by using the above-mentioned second alignment marks 15 as a reference. In such an opto-electric hybrid board, the first alignment marks 24 in the optical waveguide portion 2 are positioned relative to the end portions of the core 22, and are marks conventionally used as a reference for the mounting positions of the optical elements. In this embodiment, the surface of each of the second alignment marks 15 on the electric circuit board 1 is covered with a resin layer 16, except for a cross-shaped uncovered portion (identifying mark) 15a serving as an identifying mark, by using the first alignment marks 24 as a reference. For this reason, the cross-shaped uncovered portions 15a of the above-mentioned second alignment marks 15 are also positioned relative to the end portions of the core 22, and are used as a reference for the mounting positions of the optical elements. Additionally, in portions of the surfaces of the above-mentioned second alignment marks 15 which are covered with the resin layers 16, the resin layers 16 may be used to control luster and the like on the surfaces of the above-mentioned second alignment marks 15. For this reason, the cross-shaped uncovered portions 15a exhibit a clear contrast to the portions covered with the resin layers 16, and it is easy to recognize the cross-shaped uncovered portions 15a during the mounting of the optical elements. Thus, the mounting accuracy of the optical elements is improved. This is one of the characteristics of the present invention.

Figure 8A:
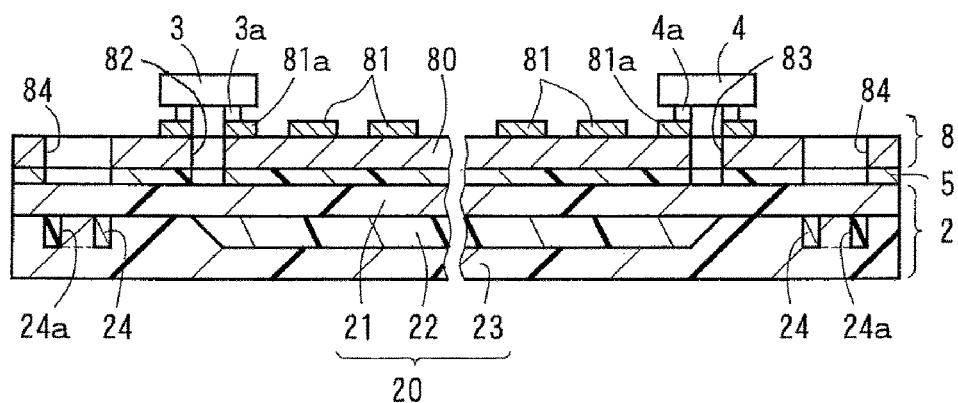
FIG. 8A is a vertical sectional view schematically showing another conventional opto-electric hybrid board.
Figure 8B:
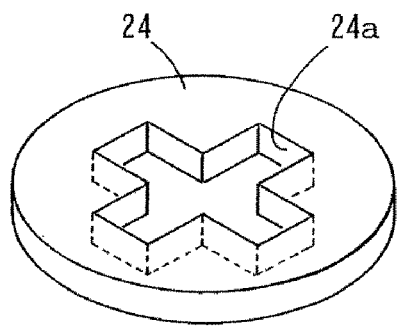
FIG. 8B is a perspective view on an enlarged scale showing an alignment mark in the conventional opto-electric hybrid board of FIG. 8A.

Description will now be given in further detail. The above-mentioned optical waveguide portion 2 includes a translucent under cladding layer 21 formed on the above-mentioned electric circuit board 1 side. The core 22 of a linear configuration for an optical path, and the first alignment marks 24 made of a material for the formation of the core 22 are formed on a surface (the lower surface as seen in the figure) of the under cladding layer 21. As shown, both left-hand and right-hand end surfaces of the above-mentioned core 22 are formed as light reflecting surfaces 22a inclined at 45 degrees to the above-mentioned electric circuit board 1. Also, each of the above-mentioned first alignment marks 24 is formed in the shape of a disk (a protrusion) including in its central position a through hole 24a having the shape of a cross as seen in plan view. The cross-shaped portion serves as an identifying mark (with reference to FIG. 8B). Uncovered portions of the above-mentioned under cladding layer 21, the core 22 and the first alignment marks 24 are covered with an over cladding layer 23. In this state, the inside of each of the above-mentioned cross-shaped through holes 24a is also filled with a material for the formation of the above-mentioned over cladding layer 23, and becomes part of the over cladding layer 23. In this manner, the above-mentioned under cladding layer 21, the core 22 and the over cladding layer 23 constitute the optical waveguide 20. Also, the above-mentioned first alignment marks 24 are embedded in the over cladding layer 23 at the surface of the under cladding layer 21.

Figure 1B:
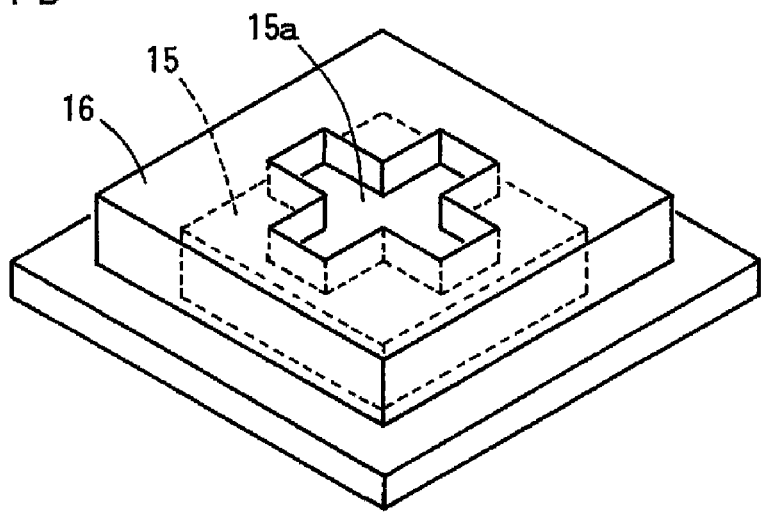
FIG. 1B is a perspective view on an enlarged scale showing a second alignment mark.

On the other hand, as shown in FIG. 1A, the above-mentioned electric circuit board 1 is constructed such that the electric circuit 11 and the second alignment marks 15 made of a material (metal) for the formation of this electric circuit 11 are formed on a surface of a stainless steel substrate 10, with an insulation layer (not shown) therebetween. As shown in FIG. 1B, each of the second alignment marks 15 is formed in the shape of a rectangular plate, and the surface of each of the second alignment marks 15 is covered with the resin layer 16, except for the cross-shaped uncovered portion 15a serving as the identifying mark. This resin layer 16 also covers an insulation layer portion surrounding each of the above-mentioned second alignment marks 15. Part of the above-mentioned electric circuit 11 serves as the mounting pads 11a for mounting the light-emitting element 3 and the light-receiving element 4 described above thereon. Light-passing through holes 12 and 13 for propagation of light between the end portions of the core 22 and the light-emitting element 3 and light-receiving element 4 are formed in portions of the above-mentioned stainless steel substrate 10 corresponding to positions over the light reflecting surfaces 22a provided in the opposite end portions of the above-mentioned core 22. Additionally, through holes 14 for the recognition of the first alignment marks 24 from the side where the electric circuit 11 is formed are formed in portions of the stainless steel substrate 10 corresponding to positions over the above-mentioned first alignment marks 24. In FIG. 1A, the reference character 3a designates a bump (an electrode) for the above-mentioned light-emitting element 3, and the reference character 4a designates a bump for the above-mentioned light-receiving element 4.

Light propagation in the above-mentioned opto-electric hybrid board is accomplished in a manner to be described below. Specifically, as shown in FIG. 1A, light L emitted from the above-mentioned light-emitting element 3 passes through the through hole 12 for light propagation formed in the above-mentioned electric circuit board 1. Thereafter, the light L passes through the under cladding layer 21, and then enters a first end portion of the core 22. Then, the light L is reflected from the light reflecting surface 22a provided in the first end portion of the above-mentioned core 22, and travels through the interior of the core 22 in an axial direction. Then, the light L is propagated to the light reflecting surface 22a provided in a second end portion of the core 22. Subsequently, the light L is reflected upwardly from the light reflecting surface 22a provided in the above-mentioned second end portion, and passes through and exits from the under cladding layer 21. Then, the light L passes through the light-passing through hole 13 of the above-mentioned stainless steel substrate 10, and thereafter is received by the light-receiving element 4.

Figure 2A:
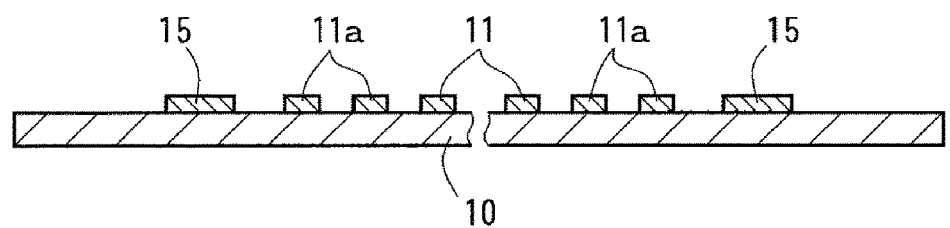
FIGS. 2A and 2B are illustrations schematically showing a process for producing an electric circuit board in a manufacturing method of the above-mentioned opto-electric hybrid board.
Figure 2B:
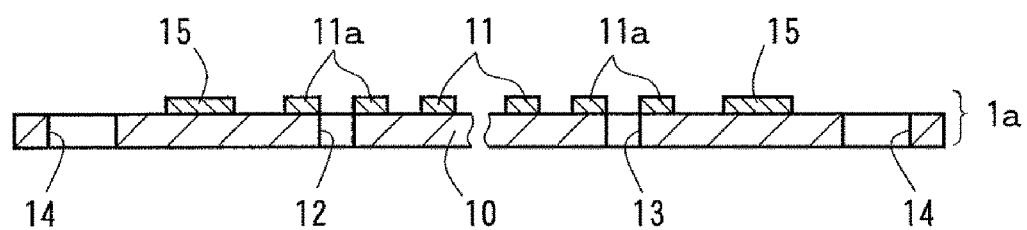
Figure 3A:
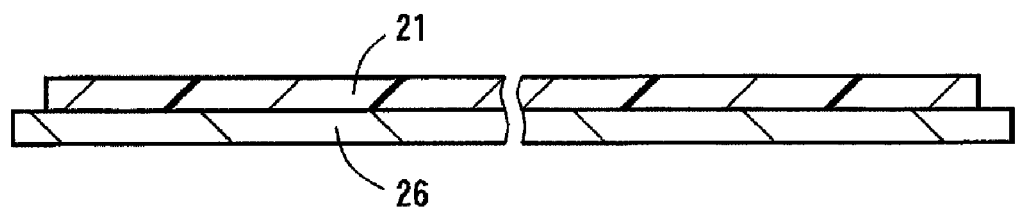
FIGS. 3A to 3C are illustrations schematically showing a process for producing an optical waveguide portion in the manufacturing method of the above-mentioned opto-electric hybrid board.
Figure 3B:
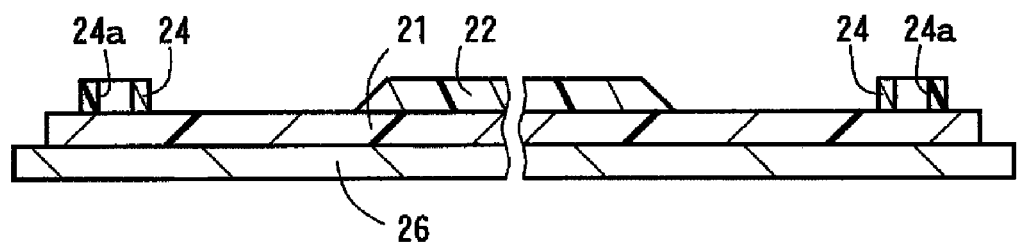
Figure 3C:
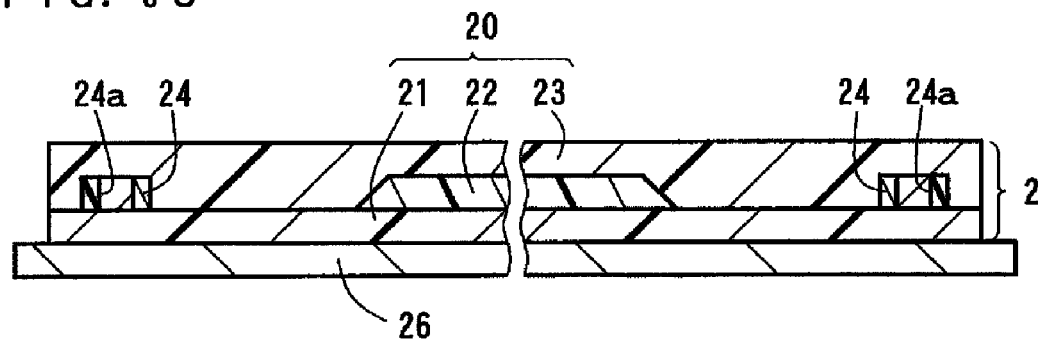
Figure 4A:
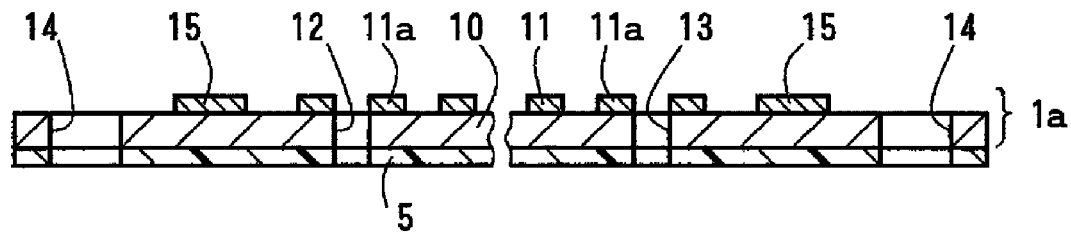
FIGS. 4A to 4C are illustrations schematically showing the step of bonding the electric circuit board and the optical waveguide portion to each other in the manufacturing method of the above-mentioned opto-electric hybrid board.
Figure 4B:
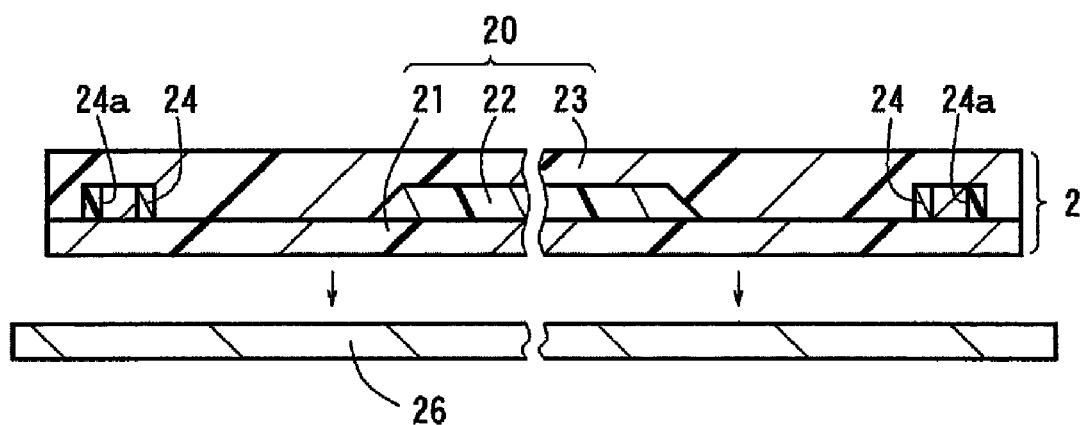
Figure 4C:
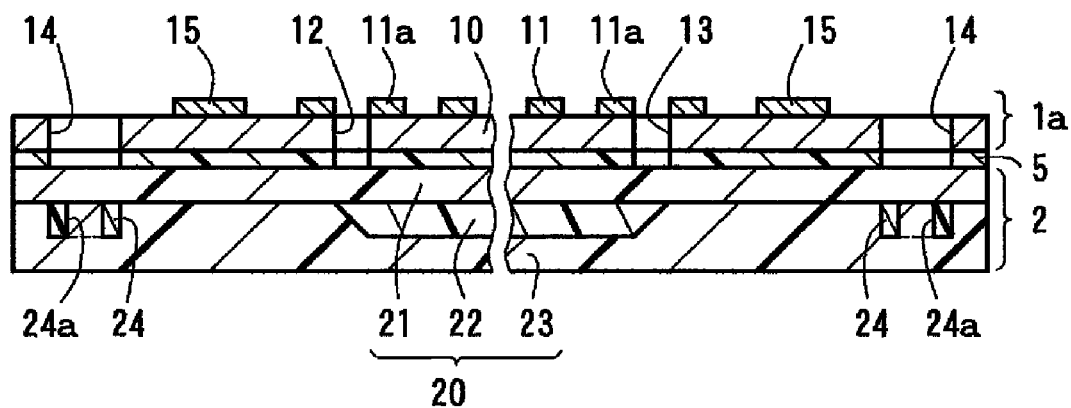
Figure 5A:
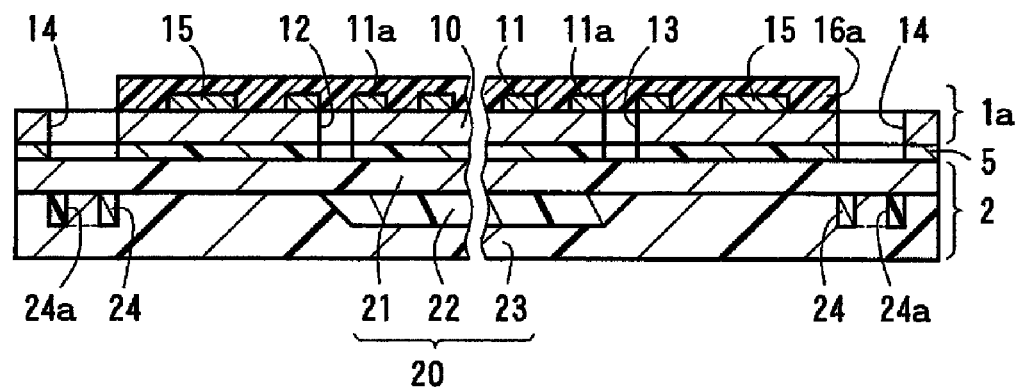
FIGS. 5A to 5C are illustrations schematically showing the step of forming a cross-shaped uncovered portion in the surface of the second alignment mark in the manufacturing method of the above-mentioned opto-electric hybrid board.
Figure 5B:
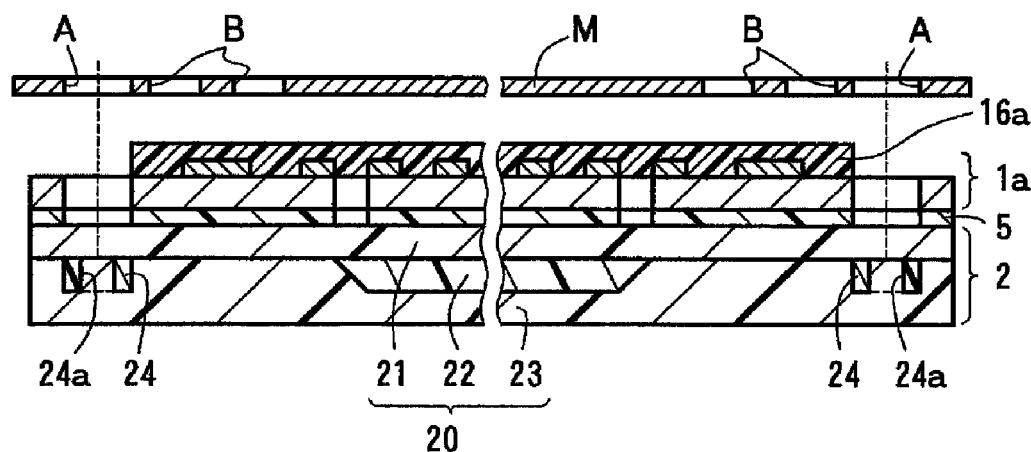
Figure 5C:
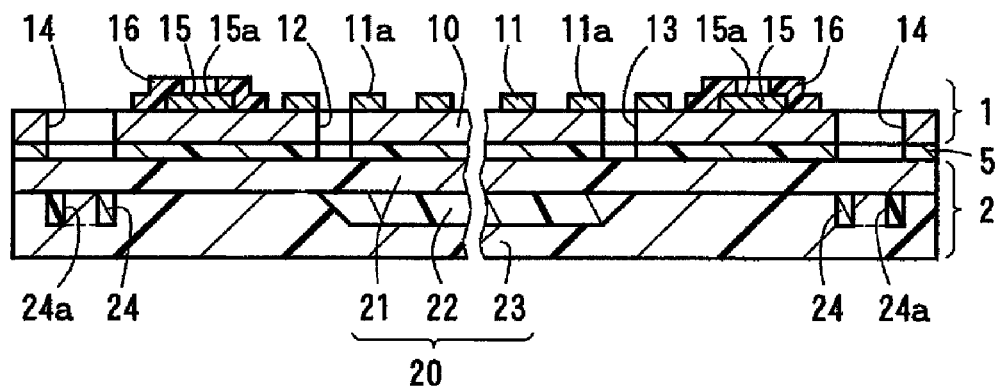
Figure 6:
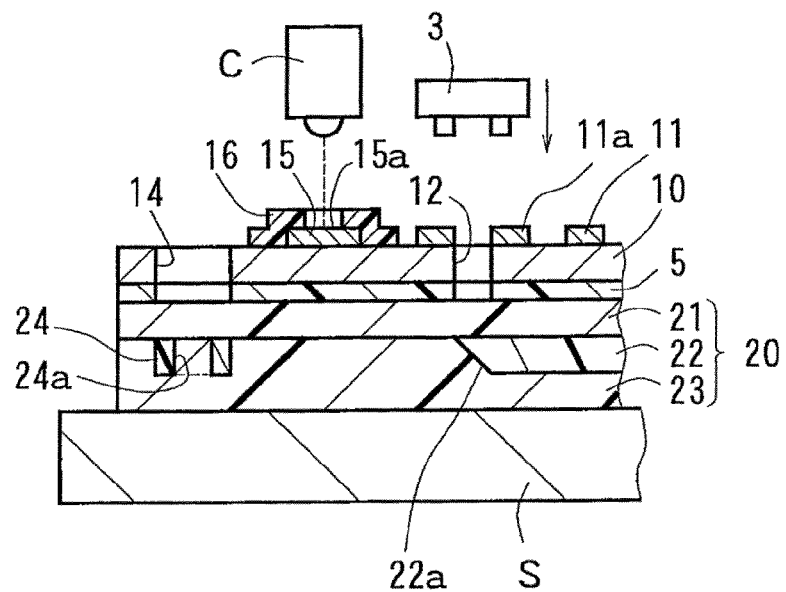
FIG. 6 is an illustration schematically showing the step of mounting an optical element in the manufacturing method of the above-mentioned opto-electric hybrid board.
Figure 7:
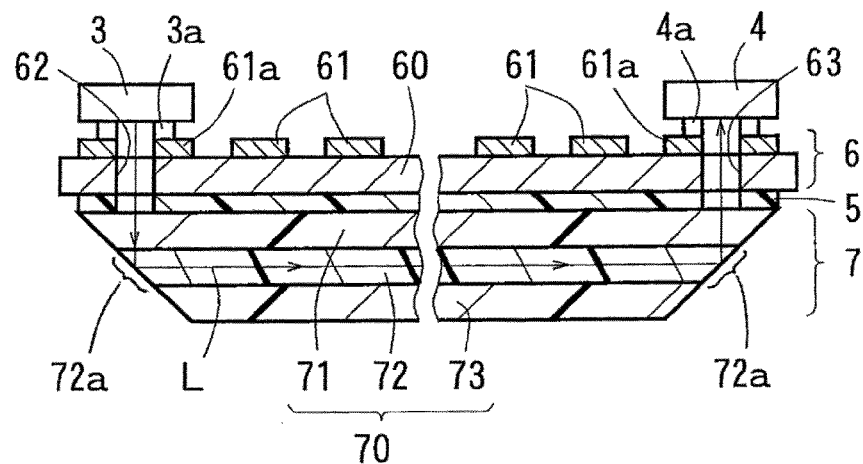
FIG. 7 is a vertical sectional view schematically showing a conventional opto-electric hybrid board.

The opto-electric hybrid board according to this embodiment is manufactured by undergoing the following process steps (1) to (5):

(1) the step of forming the electric circuit 11 and the second alignment marks 15 on the surface of the stainless steel substrate 10 to produce an electric circuit board member 1a (with reference to FIGS. 2A and 2B);

(2) the step of forming the above-mentioned optical waveguide 20 and the first alignment marks 24 to produce the optical waveguide portion 2 separately (with reference to FIGS. 3A to 3C);

(3) the step of bonding the above-mentioned electric circuit board member 1a and the optical waveguide portion 2 to each other with the adhesive 5 (with reference to FIGS. 4A to 4C);

(4) the step of forming the cross-shaped uncovered portion (identifying mark) 15a in the surface of each of the above-mentioned second alignment marks 15 to cause the above-mentioned electric circuit board member 1a to be formed into the electric circuit board 1 (with reference to FIGS. 5A to 5C); and (5) the step of mounting the light-emitting element 3 and the light-receiving element 4 on the above-mentioned electric circuit 11 (see with reference to FIG. 6).

The above-mentioned step (1) of producing the electric circuit board member 1a will be described. In this embodiment the above-mentioned stainless steel substrate 10 (with reference to FIG. 2A) is initially prepared. A stainless steel substrate having a thickness in the range of 20 to 200 μm is typically used as this stainless steel substrate 10.

Then, as shown in FIG. 2A, the insulation layer (not shown) having a predetermined pattern is formed by a photolithographic process in a predetermined position of the surface of the above-mentioned stainless steel substrate 10. This insulation layer is formed except where the light-passing through holes 12 and 13 and the through holes 14 for the recognition of the first alignment marks 24 are to be formed in the stainless steel substrate 10 in a subsequent step (with reference to FIG. 2B). Specifically, for the formation of the above-mentioned insulation layer, a photosensitive resin such as a photosensitive epoxy resin and the like is first applied to the predetermined position of the single surface (the upper surface as seen in the figure) of the above-mentioned stainless steel substrate 10 to form a photosensitive resin layer. Then, through a photomask formed with an opening pattern corresponding to the pattern of the insulation layer, the above-mentioned photosensitive resin layer is exposed to irradiation light. Next, development is performed using a developing solution to dissolve away unexposed portions, thereby forming the remaining photosensitive resin layer into the pattern of the insulation layer. Thereafter, a heating treatment is performed to remove the developing solution remaining on the surface and the like of the remaining photosensitive resin layer. Thus, the above-mentioned remaining photosensitive resin layer is formed into the insulation layer. The thickness of the insulation layer is typically in the range of 5 to 15 μm.

Next, as shown in FIG. 2A, the electric circuit 11 including the mounting pads 11a is formed in a predetermined pattern on a surface of the above-mentioned insulation layer, and the second alignment marks 15 are formed thereon in the shape of a rectangular plate. Specifically, for the formation of the electric circuit 11 and the second alignment marks 15, a metal layer (having a thickness on the order of 600 to 2600 Å) is initially formed on the surface of the above-mentioned insulation layer by sputtering, electroless plating or the like. This metal layer becomes a seed layer (a layer serving as a basis material for the formation of an electroplated layer) for a subsequent electroplating process. Then, a dry film resist is affixed to the opposite surfaces of a laminate comprised of the above-mentioned stainless steel substrate 10, the insulation layer, and the metal layer (seed layer). Thereafter, the pattern of the electric circuit 11 and a pattern such that the rectangular shape of the second alignment marks 15 appear as recessed portions are formed by a photolithographic process in the dry film resist on the side where the above-mentioned metal layer is formed, so that surface portions of the above-mentioned metal layer are uncovered at the bottoms of the recessed portions. Next, electroplating is performed to form an electroplated layer made of copper and the like (having a thickness on the order of 5 to 20 μm) in a stacked manner on the surface portions of the above-mentioned metal layer uncovered at the bottoms of the above-mentioned recessed portions. Then, the above-mentioned dry film resist is stripped away using an aqueous sodium hydroxide solution and the like. Thereafter, a metal layer portion on which the above-mentioned electroplated layer is not formed is removed by soft etching, so that the electric circuit 11 and the second alignment marks 15 are formed by a laminate portion comprised of the remaining electroplated layer and the underlying metal layer.

Then, as shown in FIG. 2B, the light-passing through holes 12 and 13 and the through holes 14 for the recognition of the first alignment marks 24 (with reference to FIG. 1A) are formed in predetermined positions of the stainless steel substrate 10 by etching or the like. The light-passing through holes 12 and 13 are formed in positions corresponding to the light reflecting surfaces 22a provided in the opposite end portions of the core 22 (with reference to FIG. 1A) to be formed in a later step of producing the optical waveguide portion 2, and the through holes 14 for the recognition of the above-mentioned first alignment marks 24 are formed in positions corresponding to the first alignment marks 24. Specifically, for the formation of these through holes 12, 13 and 14, a dry film resist is initially affixed to the opposite surfaces of a laminate comprised of the above-mentioned stainless steel substrate 10, the insulation layer, and the electric circuit 11. Thereafter, hole portions having the pattern of the above-mentioned through holes 12, 13 and 14 are formed by a photolithographic process in the dry film resist on the side where the above-mentioned insulation layer is not formed, so that surface (the lower surface as seen in the figure) portions of the above-mentioned stainless steel substrate 10 are uncovered at the bottoms of the hole portions. Next, etching or the like using an aqueous ferric chloride solution is performed to bore holes in the portions of the above-mentioned stainless steel substrate 10 uncovered at the bottoms of the above-mentioned hole portions, thereby forming the above-mentioned light-passing through holes 12 and 13 and the through holes 14 for the recognition of the first alignment marks 24. The diameter of the above-mentioned light-passing through holes 12 and 13 is set as appropriate depending on the design of the optical elements and the like, and is typically in the range of 0.05 to 0.2 mm. The diameter of the through holes 14 for the recognition of the above-mentioned first alignment marks 24 is set as appropriate depending on the size of the first alignment marks 24, and is typically in the range of 0.1 to 3.0 mm. In this manner, the step (1) of producing the above-mentioned electric circuit board member 1a is completed.

Next, the above-mentioned step (2) of producing the optical waveguide portion 2 will be described. First, a base 26 of a flat shape (with reference to FIG. 3A) for use in the production of the optical waveguide portion 2 is prepared. Examples of a material for the formation of the base 26 include glass, quartz, silicon, resins, metals and the like. The thickness of the base 26 is, for example, in the range of 20 μm to 5 mm.

Then, as shown in FIG. 3A, the under cladding layer 21 is formed on a predetermined region of a surface of the above-mentioned base 26. The formation of this under cladding layer 21 is accomplished, for example, in a manner to be described below. Specifically, a varnish prepared by dissolving a photosensitive resin for the formation of the under cladding layer 21 such as a photosensitive epoxy resin and the like in a solvent is initially applied to the predetermined region of the surface of the above-mentioned base 26. Thereafter, a heating treatment (at 50 to 120° C. for approximately 10 to 30 minutes) is performed, as required, to dry the varnish, thereby forming a photosensitive resin layer for the formation of the under cladding layer 21. Then, the photosensitive resin layer is exposed to irradiation light such as ultraviolet light and the like. This causes the photosensitive resin layer to be formed into the under cladding layer 21. The thickness of the under cladding layer 21 is typically in the range of 1 to 50 μm.

Next, as shown in FIG. 3B, the core 22 having a predetermined pattern and the disk-shaped first alignment marks 24 each including in its central position the through hole 24a having the shape of a cross as seen in plan view are formed at the same time in predetermined positions of the surface of the above-mentioned under cladding layer 21. The formation of this core 22 and the first alignment marks 24 is accomplished, for example, by a photolithographic process. Specifically, a photosensitive resin layer having a region in which the core 22 is to be formed and a region in which the first alignment marks 24 are to be formed is initially formed in a predetermined position of the surface of the above-mentioned under cladding layer 21 in a manner similar to the process for forming the photosensitive resin layer for the formation of the above-mentioned under cladding layer 21. Then, the above-mentioned photosensitive resin layer is exposed to irradiation light through a photomask formed with an opening pattern corresponding to the pattern of the core 22 and the first alignment marks 24 (including the pattern of the cross-shaped through holes 24a). Next, a heating treatment is performed. Thereafter, development is performed using a developing solution to dissolve away unexposed portions of the above-mentioned photosensitive resin layer, thereby forming the remaining photosensitive resin layer into the pattern of the core 22 and the first alignment marks 24. This causes surface portions of the above-mentioned under cladding layer 21 to be uncovered at the bottoms of the above-mentioned cross-shaped through holes 24a of the respective first alignment marks 24. Also, the above-mentioned exposure causes the core 22 to be formed in a linear shape, and causes the opposite end surfaces of the core 22 to be formed as the inclined surfaces inclined at 45 degrees. Thereafter, a heating treatment is performed to remove the developing solution remaining on the surface and the like of the remaining photosensitive resin layer. Thus, the photosensitive resin layer is formed into the core 22 and the first alignment marks 24 having the predetermined pattern. In this manner, the single photolithographic process is performed to form the core 22 and the first alignment marks 24 having the predetermined pattern at the same time, thereby forming the first alignment marks 24 in the predetermined positions relative to the end portions of the core 22.

The opposite end portions of the above-mentioned core 22 are formed so as to be positioned under the light-passing through holes 12 and 13 of the aforementioned electric circuit board member 1a, and the first alignment marks 24 are formed so as to be positioned under the through holes 14 for the recognition of the above-mentioned first alignment marks 24. The thickness of the core 22 is typically in the range of 5 to 60 μm, and the width thereof is typically in the range of 5 to 60 μm. The diameter of the above-mentioned disk-shaped first alignment marks 24 is typically in the range of 100 to 1000 μm, and the thickness thereof is typically in the range of 5 to 60 μm. The cross-shaped groove width of the through holes 24a formed in the first alignment marks 24 is typically in the range of 5 to 100 μm, and the vertical and horizontal dimensions of the cross shape are typically in the range of 5 to 900 μm.

The material for the formation of the above-mentioned core 22 and the first alignment marks 24 includes, for example, a photosensitive resin similar to that of the above-mentioned under cladding layer 21, and the material used herein has a refractive index greater than that of the material for the formation of the above-mentioned under cladding layer 21 and the over cladding layer 23 to be described below. The adjustment of this refractive index may be made, for example, by adjusting the selection of the types of the materials for the formation of the above-mentioned under cladding layer 21, the core 22 (including the first alignment marks 24) and the over cladding layer 23, and the composition ratio thereof.

Next, as shown in FIG. 3C, the over cladding layer 23 having a predetermined pattern is formed on the surface of the above-mentioned under cladding layer 21 so as to cover the above-mentioned core 22 and the first alignment marks 24. The formation of this over cladding layer 23 is accomplished, for example, by a photolithographic process. Specifically, a photosensitive resin layer for the formation of the over cladding layer 23 is initially formed on the surface of the above-mentioned under cladding layer 21 in a manner similar to the process for forming the photosensitive resin layer for the formation of the above-mentioned under cladding layer 21 so as to cover the above-mentioned core 22 and the first alignment marks 24. Then, the over cladding layer 23 having the predetermined pattern is formed by a photolithographic process using a photomask formed with an opening pattern corresponding to the pattern of the over cladding layer 23. At this time, the inside of each of the above-mentioned cross-shaped through holes 24a is also filled with the material for the formation of the above-mentioned over cladding layer 23, and becomes part of the over cladding layer 23. The thickness of this over cladding layer 23 is typically in the range of 10 to 2000 μm. An example of the material for the formation of the above-mentioned over cladding layer 23 used herein includes a photosensitive resin similar to that of the above-mentioned under cladding layer 21. In this manner, the step of producing the optical waveguide portion 2 in which the optical waveguide 20 and the first alignment marks 24 are formed on the surface of the above-mentioned base 26 is completed.

Next, the above-mentioned step (3) of bonding the above-mentioned electric circuit board member 1a and the optical waveguide portion 2 to each other will be described. Specifically, as shown in FIG. 4A, the adhesive 5 is initially applied to an opposite surface of the above-mentioned electric circuit board member 1a from the surface on which the electric circuit 11 is formed. Then, as shown in FIG. 4B, the base 26 affixed to the above-mentioned optical waveguide portion 2 is detached from the under cladding layer 21. Then, as shown in FIG. 4C, the surface (from which the base 26 is removed) of the under cladding layer 21 of the above-mentioned optical waveguide portion 2 is bonded to the above-mentioned electric circuit board member 1a with the above-mentioned adhesive 5. At this time, the end portions of the core 22 are positioned under the light-passing through holes 12 and 13 formed in the electric circuit board member 1a, and the first alignment marks 24 are positioned under the through holes 14 for the recognition of the first alignment marks 24 which are formed in the electric circuit board member 1a. In this manner, the above-mentioned step (3) of bonding the above-mentioned electric circuit board member 1a and the optical waveguide portion 2 to each other is completed.

Next, the above-mentioned step (4) of forming the cross-shaped uncovered portion (identifying mark) 15a in the surface of each of the above-mentioned second alignment marks 15 to cause the above-mentioned electric circuit board member 1a to be formed into the electric circuit board 1 will be described. The formation of this cross-shaped uncovered portion 15a is accomplished by forming the resin layer 16 so as to cover therewith the surface portion of each of the second alignment marks 15 and its surrounding insulation layer portion, except for the cross-shaped uncovered portion 15a. The formation of the resin layer 16 for covering is accomplished, for example, by a photolithographic process. Specifically, as shown in FIG. 5A, with the above-mentioned electric circuit board member 1a and the optical waveguide portion 2 bonded together, a photosensitive resin such as a cover resist ink, a solder resist ink and the like is applied to the surface of the electric circuit board member 1a on which the electric circuit 11 is formed so as to cover the electric circuit 11 and the second alignment marks 15, thereby forming a coating layer 16a thereof.

The above-mentioned photosensitive resin (coating layer 16a) is preferably semitransparent or opaque from the viewpoint of reducing or eliminating a luster and the like on the surfaces of the above-mentioned second alignment marks 15, and is more preferably opaque. The thickness of the coating layer 16a of the above-mentioned photosensitive resin (the thickness as measured from the surfaces of the second alignment marks 15) is typically in the range of 5 to 15 μm.

Then, as shown in FIG. 5B, a photomask M formed with register marks (openings) A and an opening pattern B corresponding to the pattern of the above-mentioned resin layers 16 is prepared. Next, the register marks A of the photomask M are brought into alignment with the first alignment marks 24 of the optical waveguide portion 2. In that state, the above-mentioned photomask M is placed in position. Then, the coating layer 16a of the above-mentioned photosensitive resin is exposed to irradiation light through the opening pattern B of the photomask M. Next, development is performed using a developing solution to dissolve away unexposed portions, thereby forming the remaining coating layer 16a into the pattern of the intended resin layers 16, as shown in FIG. 5C. Thereafter, a heating treatment is performed to remove the developing solution remaining on the surface and the like of the remaining coating layer 16a. Thus, the above-mentioned remaining coating layer 16a is formed into the resin layers 16.

In this embodiment, portions to be formed into the aforementioned cross-shaped uncovered portions 15a are not exposed to light during the above-mentioned exposure process, but the cross-shaped unexposed portions are dissolved away during the above-mentioned development process. Thus, the surface portions of the above-mentioned second alignment marks 15 are uncovered at the cross-shaped bottoms. In this manner, the step (4) of producing the above-mentioned electric circuit board 1 is completed.

Next, the above-mentioned step (5) of mounting the light-emitting element 3 and the light-receiving element 4 will be described. Specifically, the above-mentioned electric circuit board 1 and the optical waveguide portion 2 bonded together are set on a stage S of a mounting machine, with the surface on which the electric circuit 11 is formed facing upward, as shown in FIG. 6. Then, using an alignment recognition device C provided in the mounting machine, the cross-shaped uncovered portion 15a of one (for example, a left-hand one as seen in FIG. 1A) of the second alignment marks 15 is seen directly from above. At this time, the cross-shaped uncovered portion 15a, which has a surface of metal such as copper and the like, is lustrous, and the resin layer 16 around the cross-shaped uncovered portion 15a suppresses the luster on the above-mentioned uncovered portion 15a. For this reason, the cross-shaped uncovered portion 15a exhibits a clear contrast to the portion covered with the resin layer 16. Thus, it is easy to recognize the above-mentioned cross-shaped uncovered portion 15a by means of the above-mentioned alignment recognition device C, and the recognition is achieved in a short time. The above-mentioned mounting machine positions one of the optical elements (for example, the light-emitting element 3) in a set position (over one of the light reflecting surfaces 22a) defined using the cross-shaped uncovered portion 15a of the above-mentioned second alignment mark 15 as a reference to mount the optical element on the mounting pads 11a. The cross-shaped uncovered portion 15a of the other (for example, a right-hand one as seen in FIG. 1A) of the second alignment marks 15 is similarly recognized, and is used as a reference for positioning during the mounting of the other optical element (for example, the light-receiving element 4). Examples of the above-mentioned light-emitting element 3 include a VCSEL (Vertical Cavity Surface Emitting Laser) and the like. Examples of the above-mentioned light-receiving element 4 include a PD (Photo Diode) and the like.

Examples of a method of mounting the above-mentioned light-emitting element 3 and light-receiving element 4 include a flip-chip method, a solder reflow method, a C4 bonding method using screen printing of solder bumps and solder paste, and the like. Of these method, the flip-chip method using ultrasonic waves and heating is preferable from the viewpoint of reducing misregistration during the mounting, and the flip-chip method using ultrasonic waves is more preferable from the viewpoint of preventing heat damages to the above-mentioned stainless steel substrate 10. In this manner, the above-mentioned step (5) of mounting the light-emitting element 3 and the light-receiving element 4 is completed, and the intended opto-electric hybrid board (with reference to FIG. 1A) is obtained.

In the above-mentioned embodiment, the cross-shaped uncovered portion 15a of each of the second alignment marks 15 has a surface of metal such as copper and the like. For the exhibition of a clearer contrast, however, another metal layer may be formed on the surface of metal by plating. Further, the shape of the recessed portions 24a and 15A of the first alignment mark 24 and the second alignment mark 15, respectively, are in the shape of a cross as seen in plan view in the above-mentioned embodiment, but may be other shapes.

For the formation of the resin layers 16 covering the surface portions of the second alignment marks 15 in the above-mentioned embodiment, the photosensitive resin such as the cover resist ink and the like is applied to form the coating layer 16a. In place of the formation of the coating layer 16a, a photosensitive resin film material such as a cover resist film material and the like may be affixed.

In the above-mentioned embodiment, the electric circuit board 1 and the optical waveguide portion 2 are produced separately, and are bonded to each other with the adhesive 5. However, the optical waveguide portion 2 may be formed directly on the electric circuit board 1.

Also, the formation of the core 22 and the first alignment marks 24 is accomplished by a photolithographic process in the above-mentioned embodiment, but may be accomplished by press molding using a molding die. In this case, the molding die used herein is made of a material (for example, quartz) permeable to irradiation light such as ultraviolet light and the like, and is formed with a die surface (recessed portions) complementary in shape to the pattern of the above-mentioned core 22 and the first alignment marks 24. Then, the molding die is pressed against the photosensitive resin layer having the region in which the core 22 is to be formed and the region in which the first alignment marks 24 are to be formed. In that state, exposure to irradiation light such as ultraviolet light and the like is performed through the above-mentioned molding die. Then, a heating treatment is performed. Thereafter, the molding die is removed. In this manner, the press molding may be performed.

In the above-mentioned embodiment, the stainless steel substrate 10 is used for the production of the electric circuit board 1. However, a plate material made of other metal materials, resin materials or the like may be used. When the plate material has insulating properties, the electric circuit 11 may be formed directly on the above-mentioned substrate without the formation of the insulation layer. The above-mentioned insulation layer is provided to prevent a short circuit from occurring between the plate material having electrical conductivity such as the above-mentioned metal plate material and the electric circuit 11.

Further, the light-emitting element 3 and light-receiving element 4, and the optical waveguide 20 are disposed on the opposite surfaces with respect to the electric circuit board 1 in the above-mentioned embodiment, but may be disposed on the same surface. In this case, the end surface provided in the second end portion of the core 22 is not formed as the light reflecting surface 22a (the inclined surface) but is formed as a light-receiving and light-emitting end surface (a surface orthogonal to the electric circuit board 1).

Also, in the above-mentioned embodiment, the optical waveguide 20 and the first alignment marks 24 are formed on the surface of the base 26, and thereafter the above-mentioned base 26 is detached. However, if the above-mentioned base 26 is translucent, the base 26 may be bonded to the electric circuit board 1 without being detached.

Next, an example of the present invention will be described. It should be noted that the present invention is not limited to the example.

Example

Electric Circuit Board

An electric circuit board was produced in which an insulation layer (having a thickness of 10 μm) made of a photosensitive polyimide resin was formed on one surface of a stainless steel plate material (SUS 304 foil having a thickness of 25 μm) and in which an electric circuit including mounting pads and second alignment marks were formed on a surface of the insulation layer, the electric circuit and the second alignment marks being formed by lamination of a seed layer made of an alloy of copper, nickel and chromium, and an electro copper plated layer. Through holes for light propagation and through holes for recognition of first alignment marks were formed in this electric circuit board.

Material for Formation of Under Cladding Layer and Over Cladding Layer

A material for formation of an under cladding layer and an over cladding layer was prepared by mixing 35 parts by weight of bisphenoxyethanol fluorene glycidyl ether (component A), 40 parts by weight of 3',4'-epoxycyclohexyl methyl-3,4-epoxycyclohexane carboxylate which is an alicyclic epoxy resin (CELLOXIDE 2021P manufactured by Daicel Chemical Industries, Ltd.) (component B), 25 parts by weight of (3'4'-epoxycyclohexane)methyl-3',4'-epoxycyclohexyl-carboxylate (CELLOXIDE 2081 manufactured by Daicel Chemical Industries, Ltd.) (component C), and 2 parts by weight of a 50% propione carbonate solution of 4,4'-bis [di(β-hydroxyethoxy)phenylsulfinio]phenyl-sulfide-bis-hexafluoroantimonate (component D).

Material for Formation of Core and First Alignment Marks

A material for formation of a core and the first alignment marks was prepared by dissolving 70 parts by weight of the aforementioned component A, 30 parts by weight of 1,3,3-tris{4-[2-(3-oxetanyl)]butoxyphenyl}butane and one part by weight of the aforementioned component D in ethyl lactate.

Production of Optical Waveguide Portion

The material for the formation of the above-mentioned under cladding layer was applied to a surface of a polyethylene terephthalate (PET) film [160 mm×160 mm×188 μm (thick)] with an applicator. Thereafter, exposure by the use of irradiation with ultraviolet light at 2000 mJ/cm² was performed. Next, a heating treatment was performed at 100° C. for 15 minutes to form the under cladding layer (having a thickness of 20 μm).

Then, the material for the formation of the above-mentioned core and the first alignment marks was applied to a surface of the above-mentioned under cladding layer with an applicator. Thereafter, a drying process was performed at 100° C. for 15 minutes to form a photosensitive resin layer having a region in which the core was to be formed and a region in which the first alignment marks were to be formed. Next, a synthetic quartz chrome mask (photomask) formed with an opening pattern identical in shape with the pattern of the core and the first alignment marks was placed over the photosensitive resin layer. Then, exposure by the use of irradiation with ultraviolet light at 4000 mJ/cm² was performed by a proximity exposure method from over the mask. Thereafter, a heating treatment was performed at 80° C. for 15 minutes. Next, development was carried out using an aqueous solution of γ-butyrolactone to dissolve away unexposed portions. Thereafter, a heating treatment was performed at 120° C. for 30 minutes to form the core (having a thickness of 50 μm and a width of 50 μm) and the first alignment marks (having a thickness of 50 μm). The core was formed in a linear shape, and opposite end surfaces of the core were formed as inclined surfaces inclined at 45 degrees. Each of the first alignment marks was formed in the shape of a disk having a diameter of 1000 μm, and a through hole having the shape of a cross as seen in plan view was formed in the central position of each of the first alignment marks. The cross-shaped groove width was 50 μm, and the vertical and horizontal groove dimensions were 700 μm.

Next, the material for the formation of the over cladding layer was applied to the surface of the above-mentioned under cladding layer with an applicator so as to cover the core and the first alignment marks. Then, exposure by the use of irradiation with ultraviolet light at 2000 mJ/cm² was performed on the entire material for the formation of the over cladding layer. Thereafter, a heating treatment was performed at 120° C. for 15 minutes. This caused the first alignment marks to be embedded in the over cladding layer (having a thickness of 20 μm from the surface of the core), and caused the inside of the cross-shaped through hole to be filled with the material for the formation of the over cladding layer. In this manner, an optical waveguide portion in which an optical waveguide and the first alignment marks were formed on the surface of the above-mentioned PET film was produced.

Bonding of Electric Circuit Board and Optical Waveguide Portion

An epoxy resin based adhesive film (NA590 manufactured by Nitto Denko Corporation) was affixed to an opposite surface of the above-mentioned electric circuit board from a surface on which the electric circuit was formed. Then, the PET film affixed to the above-mentioned optical waveguide portion was detached from the under cladding layer, and the surface (from which the PET film was detached) of the under cladding layer was bonded to the above-mentioned electric circuit board with the above-mentioned epoxy resin based adhesive film. At this time, the end portions of the core under the light-passing through holes formed in the electric circuit board were made visible through the light-passing through holes. Also, the first alignment marks under the through holes for the recognition of the first alignment marks which were formed in the electric circuit board were made visible through the through holes for the recognition of the first alignment marks.

Forming Cross-Shaped Uncovered Portion (Identifying Mark) in Surface of Each Second Alignment Mark With the above-mentioned electric circuit board and the optical waveguide portion bonded together, a photosensitive resin (NPR-8V manufactured by Nippon Polytech Corp.) was applied to the surface of the electric circuit board on which the electric circuit was formed so as to cover the electric circuit and the second alignment marks. Then, a synthetic quartz chrome mask (photomask) formed with an opening pattern identical in shape with the pattern of resin layers was positioned relative to the above-mentioned first alignment marks and placed in position. Then, exposure by the use of irradiation with ultraviolet light at 600 mJ/cm² was performed by a proximity exposure method from over the mask. Next, development was carried out using a 1% aqueous solution of $Na_2CO_3$ to dissolve away unexposed portions. Thereafter, a heating treatment was performed at 150° C. for 60 minutes to form the resin layers of a rectangular configuration (1000 μm×1000 μm, and having a thickness of 10 μm) and to form an uncovered portion having the shape of a cross as seen in plan view in the central position of each of the resin layers. The cross-shaped groove width thereof was 50 μm, and the vertical and horizontal groove dimensions were 700 μm.

Recognition Degree Test for Alignment Marks

The electric circuit board and the optical waveguide portion bonded together according to Example described above were set on a stage of a flip-chip mounting machine, with the surface on which the electric circuit was formed facing upward. Then, the second alignment marks in the electric circuit board and the first alignment marks in the optical waveguide portion according to Example were recognized by means of an alignment recognition device (of a pattern matching type) provided in the mounting machine. As a result, the degree of recognition (a pattern matching score) of the second alignment marks was 85%. On the other hand, the degree of recognition of the first alignment marks was 70%.

This result shows that the second alignment marks in the electric circuit board are easy to recognize, as compared with the first alignment marks in the optical waveguide portion.

Although a specific form of embodiment of the instant invention has been described above and illustrated in the accompanying drawings in order to be more clearly understood, the above description is made by way of example and not as a limitation to the scope of the instant invention. It is contemplated that various modifications apparent to one of ordinary skill in the art could be made without departing from the scope of the invention which is to be determined by the following claims.

What was claimed was:

1. An opto-electric hybrid board comprising:
   an optical waveguide portion;
   an electric circuit portion; and
   an optical element mounted on the electric circuit portion,
   said optical waveguide portion including
   a translucent under cladding layer,
   a linear core for an optical path formed on a surface of the under cladding layer,
   a first alignment mark formed on the surface of the under cladding layer and positioned relative to an end portion of the core, and
   an over cladding layer formed on the surface of the under cladding layer and for covering said core and the first alignment mark,
   said electric circuit portion including
   a second alignment mark for positioning of the optical element and formed on a surface of said electric circuit portion on which the optical element is mounted, said second alignment mark having a surface covered with a resin layer, except for an uncovered portion for identification, wherein the uncovered portion is provided by using said first alignment mark as a reference.

2. The opto-electric hybrid board according to claim 1, wherein said second alignment mark is made of metal for an electric circuit.

3. A method of manufacturing an opto-electric hybrid board, comprising the steps of:
   (a) producing an electric circuit portion;
   (b) producing an optical waveguide portion;
   (c) mounting an optical element on the electric circuit portion,
   said step (b) including the steps of
   (b-1) forming a translucent under cladding layer,
   (b-2) forming a linear core for an optical path and a first alignment mark on a surface of the under cladding layer and positioned relative to an end portion of the core, and
   (b-3) forming an over cladding layer on the surface of the under cladding layer so as to cover the core and the first alignment mark,
   said step (a) including the steps of
   (a-1) forming an electric circuit and a second alignment mark for positioning of the optical element on a substrate, and
   (a-2) covering a surface of the second alignment mark with a resin layer, except for an uncovered portion for identification, by using the first alignment mark as a reference,
   wherein the mounting of the optical element in said step (c) is achieved by using the uncovered portion for identification of the second alignment mark as a reference.

4. The method of manufacturing the opto-electric hybrid board according to claim 3, wherein said second alignment mark is formed using metal for the electric circuit.

* * * * *